(12) United States Patent
Mureddu et al.

(10) Patent No.: US 11,929,748 B2
(45) Date of Patent: Mar. 12, 2024

(54) WOBULATED SIGNAL GENERATOR

(71) Applicants: STMICROELECTRONICS (GRENOBLE 2) SAS, Grenoble (FR); STMICROELECTRONICS (ROUSSET) SAS, Rousset (FR)

(72) Inventors: Ugo Mureddu, Fuveau (FR); Gilles Pelissier, Champagnier (FR); Guillaume Reymond, Luynes (FR)

(73) Assignees: STMICROELECTRONICS (GRENOBLE 2) SAS, Grenoble (FR); STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 18/056,153

(22) Filed: Nov. 16, 2022

(65) Prior Publication Data

US 2023/0163754 A1  May 25, 2023

(30) Foreign Application Priority Data

Nov. 19, 2021  (FR) .................................. 2112261

(51) Int. Cl.
| | |
|---|---|
| *H03K 5/133* | (2014.01) |
| *H03K 5/156* | (2006.01) |
| *G11C 7/22* | (2006.01) |
| *G11C 8/18* | (2006.01) |

(52) U.S. Cl.
CPC .......... *H03K 5/133* (2013.01); *H03K 5/1565* (2013.01); *G11C 7/222* (2013.01); *G11C 8/18* (2013.01)

(58) Field of Classification Search
None
See application file for complete search history.

(56) References Cited

U.S. PATENT DOCUMENTS

| | | | |
|---|---|---|---|
| 4,905,176 A | | 2/1990 | Schulz |
| 5,982,213 A | * | 11/1999 | Schenck ............... H03K 5/131 327/276 |
| 9,520,885 B1 | | 12/2016 | Luo et al. |

(Continued)

FOREIGN PATENT DOCUMENTS

WO    WO 2005072298 A2    8/2005

OTHER PUBLICATIONS

Abidi, "Phase Noise and Jitter in CMOS Ring Oscillators," *IEEE Journal Of Solid-State Circuits* 41(8): 1803-1816, Aug. 2006.

(Continued)

*Primary Examiner* — Cassandra F Cox
(74) *Attorney, Agent, or Firm* — Seed IP Law Group LLP (57) ABSTRACT

A wobulated signal generator includes a chain of delay elements and control circuitry. The chain of delay elements includes first delay elements, second delay elements, and third delay elements. The control circuitry, in operation, enables a number of the first delay elements, disables a number of the third delay elements, and enables a selected number of the second delay elements, defining a period of time between two consecutive rising edges of a digital wobulated signal at an output of the wobulated signal generator. The control circuitry monitors an average frequency of the digitally wobulated signal, and selectively modifies the number of enabled first delay elements and the number of disabled third delay elements based on the monitored average frequency of the digitally wobulated signal.

29 Claims, 6 Drawing Sheets

(56) References Cited

U.S. PATENT DOCUMENTS

| | | | |
|---|---|---|---|
| 9,941,889 B1* | 4/2018 | Guo | H03K 21/00 |
| 10,868,523 B2* | 12/2020 | Li | H03L 7/113 |
| 2009/0222502 A1 | 9/2009 | Ikegami et al. | |
| 2009/0248771 A1 | 10/2009 | Vergnes et al. | |
| 2012/0068775 A1 | 3/2012 | Leistad et al. | |

OTHER PUBLICATIONS

Bochard et al., "True-Randomness and Pseudo-Randomness in Ring Oscillator-Based True Random No. Generators," *International Journal of Reconfigurable Computing*, vol. 2010 (article 879281), Dec. 2010 (14 pages).

Hajimiri et al., "Jitter and Phase Noise in Ring Oscillators," *IEEE Journal of Solid-State Circuits* 34(6): 790-804, Jun. 1999.

Markettos et al., "The Frequency Injection Attack on Ring-Oscillator-Based True Random Number Generators," *CHES (Cryptographic Hardware and Embedded Systems) 11th International Workshop*, Lausanne, Switzerland, Sep. 6-9, 2009, C. Clavier and K. Gaj (Eds.): LNCS 5747, pp. 317-331.

Mureddu et al., "Experimental Study of Locking Phenomena on Oscillating Rings Implemented in Logic Devices," *IEEE Transactions On Circuits And Systems—I: Regular Papers* 66(7):2560-2571, Jul. 2019.

Petura et al., "A survey of AIS-20/31 compliant TRNG cores suitable for FPGA devices," *26th International Conference on Field—Programmable Logic and Applications*, Lausanne, Switzerland, Aug. 29-Sep. 2, 2016. (11 pages).

Sunar et al., "A Provably Secure True Random Number Generator with Built-in Tolerance to Active Attacks," *IEEE Transactions on Computers* 56(1), Feb. 2007. (32 pages).

Zhang et al., "A Survey on Silicon PUFs and Recent Advances in Ring Oscillator PUFs," *Journal Of Computer Science And Technology* 29(4): 664-678, Jul. 2014.

Baudet et al., "On the security of oscillator-based random number generators," *Journal of Cryptology* 24, 2011. (28 pages).

Bayon et al., "Contactless Electromagnetic Active Attack on Ring Oscillator Based True Random No. Generator," COSADE: Constructive Side-Channel Analysis and Secure Design, Darmstadt, Germany, May 2012. (17 pages).

Cherkaoui et al., "A Very High Speed True Random No. Generator with Entropy Assessment," CHES 2013, LNCS 8086, 2013, pp. 179-196.

Kohlbrenner et al., "An Embedded True Random No. Generator for FPGAs," *FPGA'04*, Monterey, California, USA, Feb. 22-24, 2004, pp. 71-78.

Simka et al., "Testing of PLL-based True Random Number Generator in Changing Working Conditions," *Radioengineering* 20(1):94-101, Apr. 2011. (9 page).

Turan et al., "Recommendation for the Entropy Sources Used for Random Bit Generation," NIST Special Publication 800-90B, Jan. 2018. (84 pages).

\* cited by examiner

WOBULATED SIGNAL GENERATOR

BACKGROUND

Technical Field

The present disclosure generally concerns devices and systems adapted to generating digital signals, and more particularly devices and systems adapted to generating digital wobulated signals. The present disclosure further discloses means for regulating a digital wobulated signal.

Description of the Related Art

A wobulated signal is an oscillating signal having a time-varying frequency. More particularly, a signal may be a signal of substantially square shape having a substantially constant duty cycle, for example, constant, and having a time-varying frequency.

BRIEF SUMMARY

In an embodiment, a wobulated signal generator includes a chain of delay elements and control circuitry. The chain of delay elements includes first delay elements, second delay elements, and third delay elements. The control circuitry, in operation, enables a number of the first delay elements, disables a number of the third delay elements, and enables a selected number of the second delay elements, defining a period of time between two consecutive rising edges of a digital wobulated signal at an output of the wobulated signal generator. The control circuitry monitors an average frequency of the digitally wobulated signal, and selectively modifies the number of enabled first delay elements and the number of disabled third delay elements based on the monitored average frequency of the digitally wobulated signal.

In an embodiment, a device includes a chain of delay elements and control circuitry. The chain of delay elements includes first delay elements, second delay elements, and third delay elements. The control circuitry, in operation, enables a number of the first delay elements, disables a number of the third delay elements, and enables a selected number of the second delay elements, defining a period of time between two consecutive rising edges of a digital wobulated signal at an output node of the device. The control circuitry monitors an average frequency of the digitally wobulated signal, and selectively modifies the number of enabled first delay elements and the number of disabled third delay elements based on the monitored average frequency of the digitally wobulated signal.

In an embodiment, a system comprises a memory, and a wobulated signal generator coupled to the memory. The wobulated signal generator includes a chain of delay elements including first delay elements, second delay elements, and third delay elements, and control circuitry coupled to the chain of delay elements. An output node is coupled to the chain of delay elements. The control circuitry, in operation: enables a number of the first delay elements; disables a number of the third delay elements; enables a selected number of the second delay elements, defining a period of time between two consecutive rising edges of a digital wobulated signal at the output node; monitors an average frequency of the digitally wobulated signal; and selectively modifies the number of enabled first delay elements and the number of disabled third delay elements based on the monitored average frequency of the digitally wobulated signal.

In an embodiment, a method comprises generating a delayed digital signal using a chain of delay elements including first delay elements, second delay elements, and third delay elements; and generating a digital wobulated signal based on the delayed signal. Generating the delayed digital signal comprises: enabling a number of the first delay elements; disabling a number of the third delay elements; enabling a selected number of the second delay elements, defining a period of time between two consecutive rising edges of the digital wobulated signal; monitoring an average frequency of the digitally wobulated signal; and selectively modifying the number of enabled first delay elements and the number of disabled third delay elements based on the monitored average frequency of the digitally wobulated signal.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures, unless the context indicates otherwise. In particular, the structural and/or functional features that are common among the various embodiments may have the same references and may dispose identical or similar structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

The signals mentioned in the disclosure are digital signals comprising a high state and a low state respectively corresponding to logic data "1" and "0." The high state represents, unless otherwise mentioned, a high voltage level, for example, equal to a power supply voltage. The low state shows, unless otherwise specified, a low voltage level, for example, equal to a reference voltage, for example, the ground.

Figure 1:
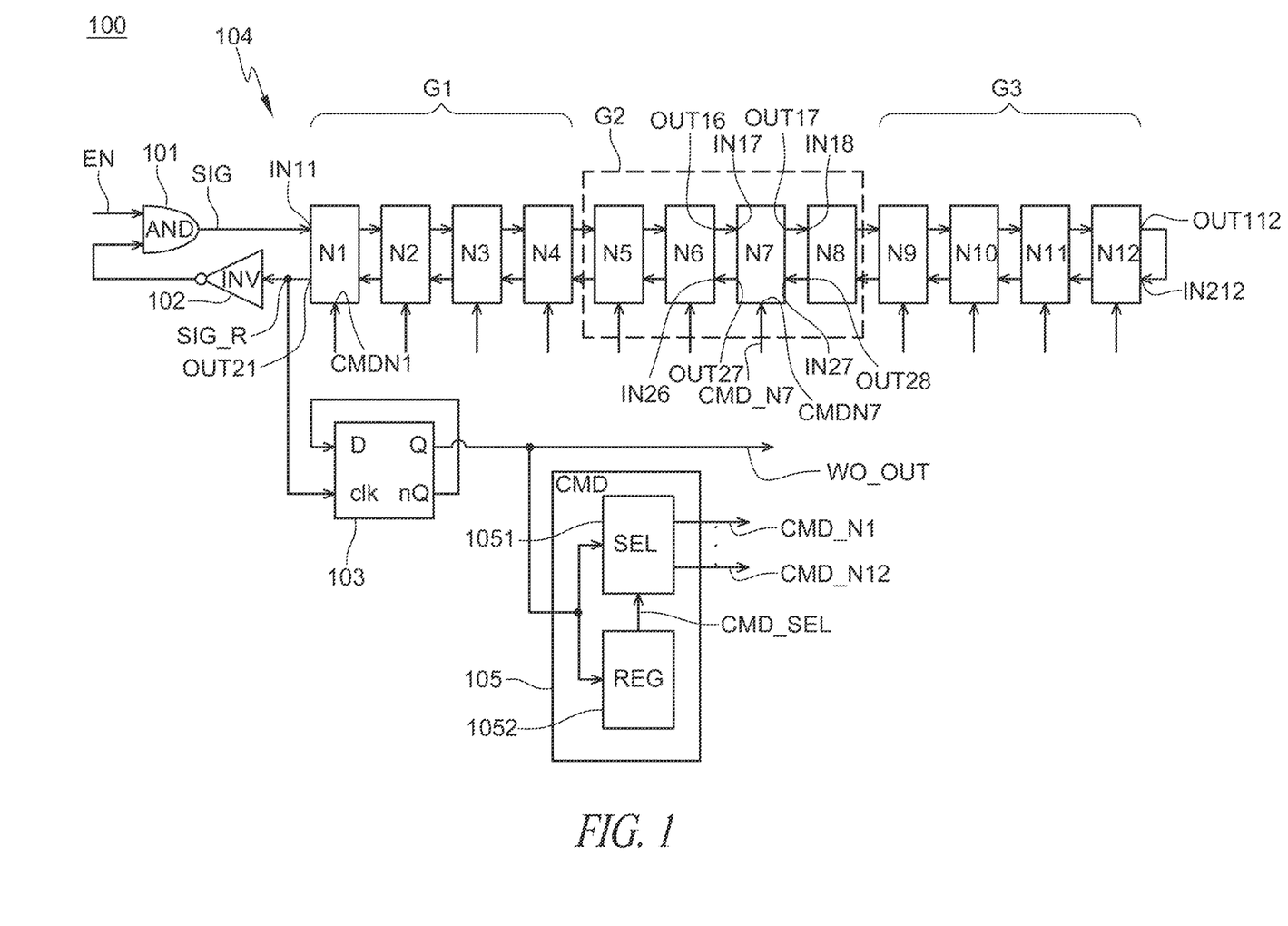
FIG. 1 schematically shows in the form of blocks an embodiment of a digital wobulated signal generator.

FIG. 1 schematically shows in the form of blocks an embodiment of a device adapted to generating a digital wobulated signal, or digital wobulated signal generator 100. The operation of generator 100 is described in further detail in relation with FIG. 2.

Generator 100 comprises, at its input, an AND-type logic gate 101, or AND gate 101, having, for example, two follower inputs, and one output. Gate 101 receives on one of its follower inputs an enable signal EN, and delivers a digital signal SIG on its output. According to a variant, gate 101 comprises an inverting input and a follower input.

Generator 100 further comprises an inverting input 102 (INV) comprising an input and an output. The output of gate 102 is coupled, for example, connected, to the follower input of AND gate 101. Inverting gate 102 receives, as an input, the delayed signal SIG noted SIG_R.

Generator 100 further comprises a D-type flip-flop 103, comprising a data input D, a clock input clk, an output Q, and an inverting output nQ. Data input D is coupled, for example, connected, to the inverting output nQ of flip-flop 103. Clock input clk is coupled, for example, connected, to the input of inverting gate 102, and thus receives delayed signal SIG_R. The Q output delivers an output digital wobulated signal WO_OUT.

As previously mentioned, a digital wobulated signal is an oscillating signal having a frequency, and accordingly a period, varying over time. More particularly, a digital wobulated signal may be a signal of substantially square shape having a substantially constant duty cycle, for example, constant, and having a frequency, and accordingly a period, varying over time. According to an example, the period of a digital wobulated signal is modified at each new rising or falling edge of the signal. According to a variant, the period of a digital wobulated signal may be modified after a random number of rising or falling edges. It is defined, for the rest of the description, that the period of a digital wobulated signal is the time period between two successive rising edges of the digital wobulated signal.

Generator 100 further comprises a chain 104 of elements capable of being enabled, adapted to delaying digital signal SIG to deliver signal SIG_R. Chain 104 may also be called a series or a list of elements adapted to delaying a digital signal. The elements capable of being enabled adapted to delaying a digital signal, or delay elements in the following description, are a component or an assembly of components adapted to adding a time delay to a digital signal when they are enabled, and to adding no time delay to said signal when they are not enabled. An example of embodiment of a delay element is described in relation with FIG. 3. According to an example, all the delay elements of chain 104 are adapted to adding a same delay time period, called delay hereafter, to a digital signal, but according to a variant, each delay element of chain 104 may be adapted to adding a different delay.

In FIG. 1 and to avoid overloading the drawing, chain 104 comprises twelve elements N1 to N12. However, generally, chain 104 may comprise a number K of delay elements, K being an integer for example in the range from 12 to 40, for example, equal to 16 or 32. Each delay element Ni, i being an integer varying from 1 to 12, or from 1 to K, comprises two inputs IN1$i$ and IN2$i$, two outputs OUT1$i$ and OUT2$i$, and a control terminal CMDNi receiving a control signal CMD_Ni.

To form chain 104, delay elements N1 to N12 are coupled "in series," that is, elements N1 to N12 are coupled to one another to form a line. More particularly, each element Ni has:
its input IN1$i$ coupled, for example, connected, to the output OUT1$i$−1 of the element Ni−1 of previous rank;
its output OUT1$i$ coupled, for example, connected, to the input IN1$i$+1 of the element Ni+1 of next rank;
its input IN2$i$ coupled, for example, connected, to the output OUT2$i$+1 of the element Ni+1 of next rank; and
its output OUT2$i$ coupled, for example, connected, to the input IN2$i$−1 of the element Ni−1 of previous rank.

The delay element of rank 1 of chain 104, that is, the first delay element of chain 104, that is, element N1 in FIG. 1, has its input IN11 coupled, for example, connected, to the output of AND gate 101, and thus receives digital signal SIG. Further, delay element N1 has its output OUT21 coupled, for example, connected, to the input of inverting gate 102 and to the clock input clk of branch 103, and thus delivers delayed signal SIG_R. Further, the delay element of maximum rank, that is, the last delay element of chain 104, that is, element N12 in FIG. 1, has its output OUT112 coupled, for example, connected, to its own input IN212.

According to an embodiment, the delay elements N1 to N12 of chain 104 are distributed into three groups of delay elements, among which:
a group G1 of delay elements (first elements) enabled, or active, by their control signals;
a group G2 of delay elements (second elements) capable of being enabled by their control signals; and
a group G3 of delay elements (third elements) disabled, or non-active, by their control signals.

More particularly, group G1 comprises k1 delay elements arranged at the beginning of chain 104. In other words, group G1 comprises the k1 first delay elements of chain 104, that is, the k1 delay elements having a rank in the range from 1 to k1. In FIG. 1, k1 is equal to four, and group G1 comprises elements N1 to N4.

More particularly, group G2 comprises k2 delay elements arranged in the middle of chain 104. In other words, group G2 comprises the k2 delay elements arranged between the elements of group G1 and the elements of group G3, that is, the k2 delay elements having a rank in the range from k1+1 to k1+k2. In FIG. 1, k2 is equal to four, and group G2 comprises elements N5 to N8. Call group G2 the active window of generator 100.

More particularly, group G3 comprises k3 delay elements arranged at the end of chain 104. In other words, group G3 comprises the k3 last delay elements of chain 104, that is, the k3 delay elements having a rank in the range from k1+k2+1 to k1+k2+k3. In FIG. 1, k3 is equal to four, and group G3 comprises elements N9 to N12.

Generator 100 further comprises a control circuit 105 (CMD) adapted to controlling the delay elements of chain 104. Circuit 105 comprises an input receiving the output digital wobulated signal WO_OUT, and as many outputs as delay elements of chain 104 delivering control signals CMD_N1, . . . , CMD_N12 to the delay elements. In other words, the input of control circuit 105 is coupled, for example, connected, to the Q output of flip-flop 103, and each output of the control circuit is coupled, for example, connected, to a terminal CMDNi of an element Ni of chain 104.

Control circuit 105 comprises a selection unit or circuit 1051 (SEL) and a regulation unit or circuit 1052 (REG).

Selection unit 1051 is used to modify the number of enabled delay elements of chain 104. The selection unit receives signal WO_OUT, a control signal CMD_SEL, and delivers control signals CMD_N1, . . . , CMD_N12 to the delay elements. More particularly, and as described in further detail in relation with FIG. 2, selection unit 1051 is adapted to periodically modifying the number of enabled delay elements of chain 104, for example, at each new rising edge of output signal WO_OUT.

Regulation unit 1052 is used to verify whether the average frequency Fmean, or in the same way the average period Pmean, of output signal WO_OUT, is equal to a targeted central average frequency Fcentral, or reference frequency, or in the same way to a targeted central period Pcentral, by comparing average frequency Fmean with central frequency Fcentral, and to deliver a control signal CMD_SEL enabling to correct said average frequency if need be. For this purpose, regulation unit 1052 receives signal WO_OUT and delivers control signal CMD_SEL to selection unit 1051. Examples of embodiment of regulation unit 1051 are described in relation with FIGS. 4 and 5.

Control circuit 105 comprises two operating modes, a normal operating mode and a regulation mode. The normal operating mode is described in relation with FIG. 2, and the regulation mode is then described. The regulation mode may be implemented regularly, for example, periodically, or occasionally.

An advantage of generator 100 is that it is not or little affected by locking phenomena. Indeed, generator 100 being capable of modifying its frequency, is capable of preventing the occurrence of a locking phenomenon.

Figure 2:
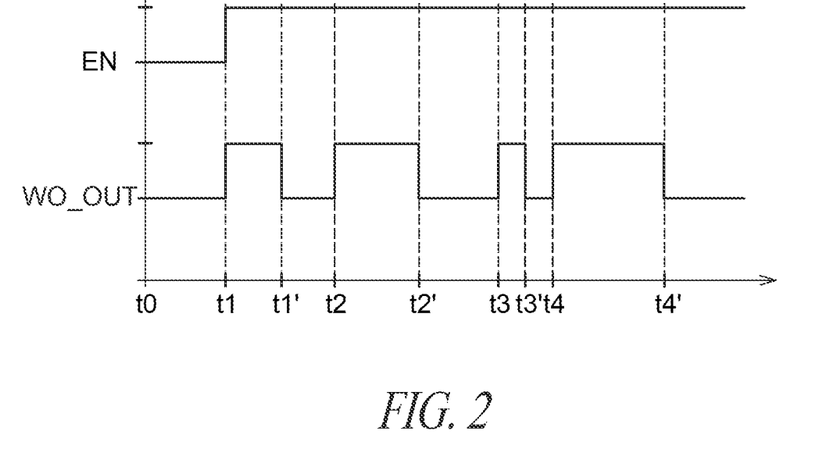
FIG. 2 shows two timing diagrams illustrating the operation of the generator of FIG. 1.

FIG. 2 shows two timing diagrams illustrating the operation in a normal operating mode of the control circuit 105 of the generator 100 described in relation with FIG. 1. More particularly, FIG. 2 shows a timing diagram of enable signal EN and of the output signal WO_OUT of generator 100.

Between an initial time t0 and a time t1, subsequent to time t0, signal EN is in a low state and generator 100 has not been started. Signal SIG then is in a low state. Signal SIG_R does not exhibit a rising edge enabling to switch output signal WO_OUT at the output of flip-flop 103, and thus signal WO_OUT is at a low level. The output signal of inverting gate 102 is in a high state.

From time t1, generator 100 starts, and signal EN switches to a high level. Signal SIG switches to a high level and signal SIG_R then starts oscillating at a frequency defined by the number of delay elements enabled in chain 104 by selection unit 1051. More particularly, selection unit 1051 enables all the delay elements of group G1, that is, k1 delay elements, and selects a number k2(1) of delay elements from among group G2, k2(1) being smaller than k2, and also enables them. The delay accumulated by the signal crossing chain 104 is defined by the sum of the delays imposed by the enabled delay elements of chain 104. In the case where all the delay elements enable to add a same delay R, the delay accumulated by signal SIG_R is equal to (k1+k2(1))*R, that is, delay R multiplied by the sum of numbers k1 and k2(1). It should be noted that the minimum delay added by chain 104 is the delay added by the delay element of group G1, and that the maximum delay is the delay added by the delay elements of group G1 and all the delay elements of group G2.

Flip-flop 105 receives on its clock input clk oscillating signal SIG_R, and delivers as an output wobulated oscillating signal WO_OUT. Signal WO_OUT changes state each time signal SIG_R exhibits a rising edge. More particularly, at time t1, signal WO_OUT switches from a low level to a high level since the output signal of chain 104 exhibits a rising edge. At a time t1', successive to time t1, signal WO_OUT switches from the high level to the low level since signal SIG_R exhibits a rising edge.

At a time t2, successive to time t1', signal WO_OUT has performed a full period at the frequency imposed by chain 104. More particularly, signal WO_OUT has switched to a high level for (k1+k2(1))*R, and then to a low level for this same time period (k1+k2(1))*R, when all the delay elements add a same delay R. The selection unit modifies the control signals to enable a number k2(2) of delay elements of group G2 and no longer k2(1) delay elements. Number k2(2) is smaller than number k2 and is, for example, different from number k2(1). At a time t2', successive to time t2, signal WO_OUT switches from the high level to the low level, since signal SIG_R exhibits a new rising edge.

At a time t3, successive to time t2', signal OUT has performed a new full period, and thus selection unit 1051 modifies the control signals to enable a number k2(3) of delay elements of group G2. Number k2(3) is smaller than number k2 and is, for example, different from number k2(2). At a time t3', successive to time t3, signal WO_OUT switches from the high level to the low level, since signal SIG_R exhibits a new rising edge.

At a time t4, successive to time t3', signal WO_OUT has performed a new full period, and thus the control circuit modifies the control signals to enable a number k2(4) of delay elements of group G2. Number k2(4) is smaller than number k2, and k2(4) is, for example, different from number k2(3). At a time t4', successive to time t4, signal OUT switches from the high level to the low level, since signal SIG_R exhibits a new rising edge.

The normal operating mode continues in this manner to deliver digital wobulated signal WO_OUT.

The regulation mode of the control circuit 105 of the generator 100 of FIG. 1 is now described. In this mode, regulation unit 1052 has detected that, for a certain time period, the average frequency Fmean of output signal WO_OUT is different from the targeted central frequency Fcentral, or that the average period Pmean is different from the targeted central period Pcentral. Regulation unit 1052 then controls selection unit 1051 so that it modifies the number of elements comprised in groups G1, G2, and/or G3 for the next normal operating mode. According to an embodiment, in this case, selection unit 1051 only modifies the numbers k1 and k3 of delay elements of groups G1 and G3, and leaves number k2 unchanged to "offset" group G2 in chain 104, or to "offset the active window" of generator 100. According to another embodiment, in this case, selection unit 1051 modifies numbers k1, k2, and k3 and thus modifies the total distribution of the delay elements in groups G1, G2, and G3.

More particularly, when regulation unit 1052 detects that the average frequency Fmean of the output signal is greater than the targeted central frequency Fcentral, regulation unit 1052 asks selection unit 1051 to increase the number k1 of always enabled delay elements of group G1, and to decrease the number of always disabled delay elements k3 of group G3. According to an example, the number k2 of delay elements of group G2 is unchanged or is modified. Indeed, if average frequency Fmean is greater than the targeted central frequency Fcentral, then the signal is "too fast" and should be generally slowed down. For this purpose, the delay added to output signal WO_OUT is generally increased.

Conversely, when regulation unit 1052 detects that the average frequency Fmean of the output signal is smaller than the targeted central frequency Fcentral, regulation unit 1052 asks selection unit 1051 to decrease the number k1 of always enabled delay elements of group G1, and to increase the number of always disabled delay elements k3 of group G3. According to an example, the number k2 of delay elements of group G2 is unchanged or is modified. Indeed, if average frequency Fmean is smaller than the targeted central frequency Fcentral, then the signal is "too slow," and should be generally accelerated. For this purpose, the delay added to output signal WO_OUT is generally decreased.

Figure 4:
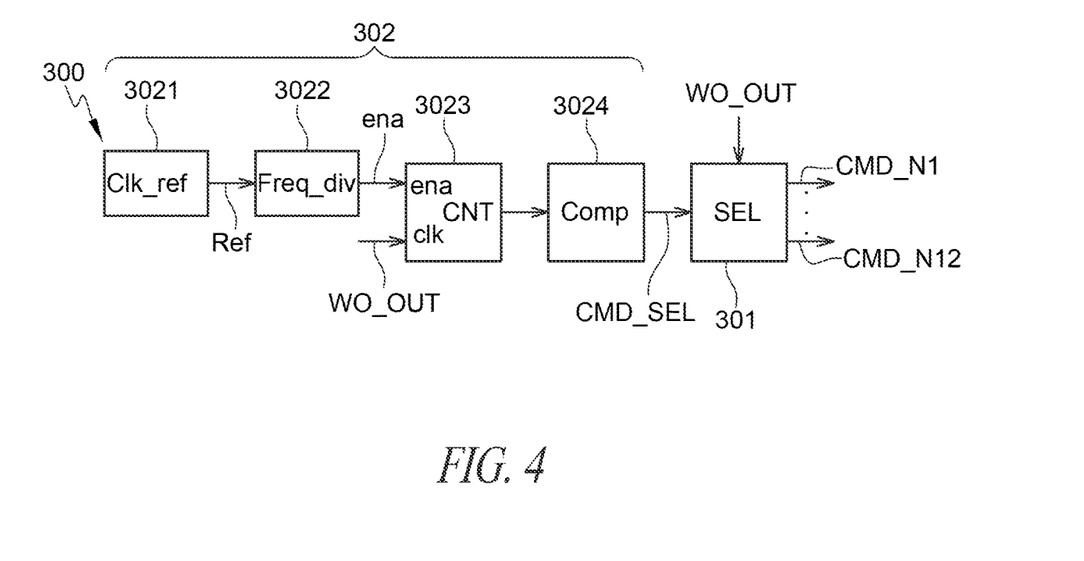
FIG. 4 schematically shows in the form of blocks an example of embodiment of a regulation circuit of the generator of FIG. 1.
Figure 5:
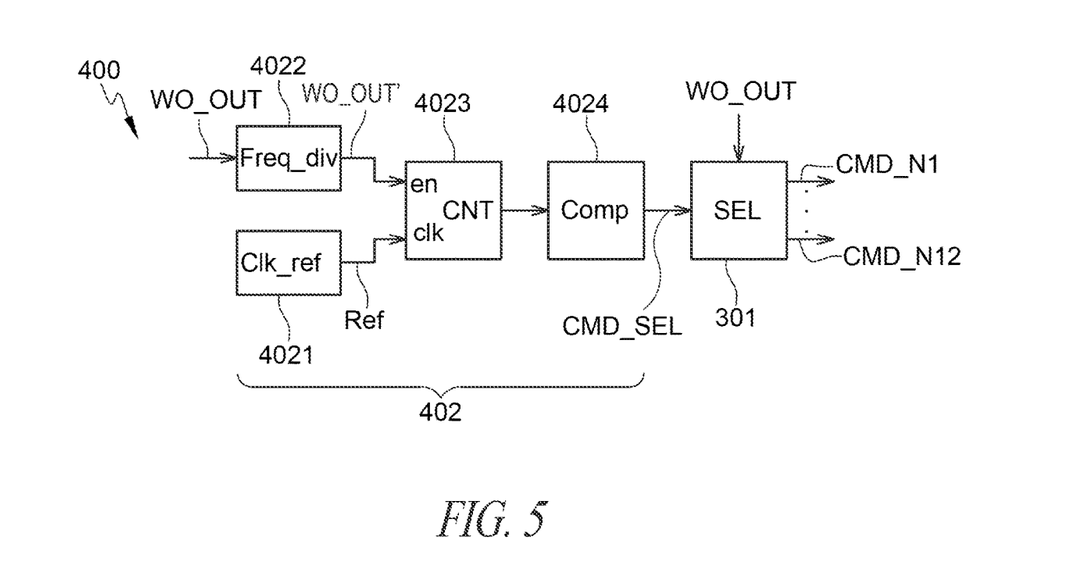
FIG. 5 schematically shows in the form of blocks another example of embodiment of a regulation circuit of the generator of FIG. 1.

The quantification of the modifications of numbers k1, k2, and k3 may be performed in different ways, some of which are described in relation with FIGS. 4 and 5.

Figure 3:
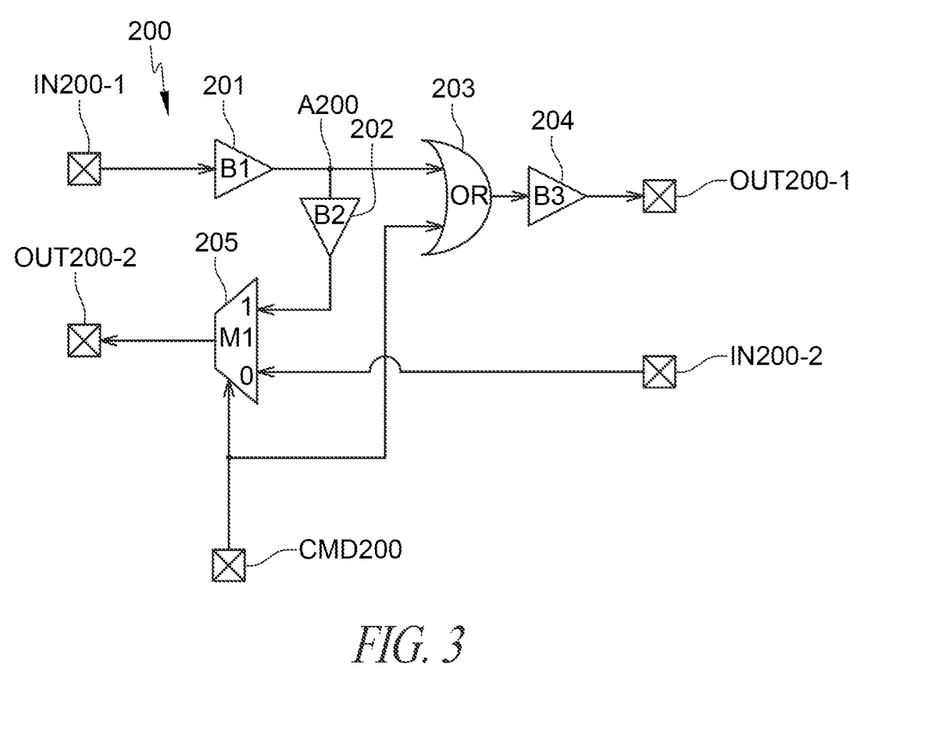
FIG. 3 shows a logic diagram of an example of embodiment of a delay element of the generator of FIG. 1.

FIG. 3 is an electric diagram of an example of embodiment of a delay element 200 of the type of a delay element of the chain 104 of the generator 100 described in relation with FIG. 1.

As previously described, delay element 200 comprises two inputs IN200-1 and IN200-2, two outputs OUT200-1 and OUT200-2, and a control terminal CMD200.

Delay element 200 comprises a first buffer device 201 (B1) or buffer amplifier 201, comprising an input and an output, and adapted to adding a delay to a digital signal. The input of buffer device 201 is coupled, for example, connected, to input IN200-1 and its output is coupled, for example, connected, to a node A200. Buffer device 201 is optional.

Delay element 200 further comprises a second buffer device 202 (B2), of buffer amplifier 202, comprising an input and an output, and adapted to adding a delay to a digital signal. The input of buffer device 202 is coupled, for example, connected, to node A200. Buffer device 202 is optional.

Delay element 200 further comprises an OR-type logic gate 203 (OR), or OR gate 203, comprising two follower inputs and one output. A first input of gate 203 is coupled, for example, connected, to node A200 and a second input of gate 203 is coupled, for example, connected, to control terminal CMD200.

Delay element 200 further comprises a third buffer device 204 (B3), or buffer amplifier 204, comprising an input and an output, adapted to adding a delay to a digital signal. The input of buffer device 204 is coupled, for example, connected, to the output of OR gate 203, and its output is coupled, for example, connected, to output OUT200-1. Buffer device 204 is optional.

Delay element 200 further comprises a multiplexer 205 (M1) comprising two inputs, one output, and one control terminal. The control terminal is coupled, for example, connected, to the control terminal CMD200 of delay element 200. A first input (1) selected when the control signal is in a high state, is coupled, for example, connected, to the output of buffer device 202. A second input (0), selected when the control signal is in a low state is coupled, for example, connected, to the input IN200-2 of delay element 200. The output is coupled, for example, connected, to the output OUT200-2 of delay element 200.

The delay element operates as follows. When the delay element is enabled, a signal received on input IN200-1 is delivered on output OUT200-2 with a given delay. When the delay element is disabled, a signal received on input IN200-2 is delivered on output OUT200-2 with no delay.

More particularly, when the delay element is disabled, the delay element receives on its control terminal CMD200 a control signal in a low state. The signal delivered by the output of OR gate 203 is equal to the signal received by input IN200-1. Delay element 200 delivers on its output OUT200-1 a signal delayed by buffer devices 201 and 204. As described in FIG. 1, delay element 200 may form part of a chain of delay elements where the delay elements are coupled in series. Thus, output OUT200-1 is either coupled to an input of another delay element, or coupled to the input IN200-2 of element 200. The signal received by input IN200-2 is delivered to output OUT200-2, since the multiplexer delivers as an output the signal that it has received on its second input (0).

More particularly, when the delay element is enabled, the delay element receives on its control terminal CMD200 a control signal in a high state. Multiplexer 205 delivers on its output the signal that it receives on its first input (1), that is, the signal delivered at the output of buffer device 202. Further, in this case, the output of OR gate 203 is still in a high state.

FIG. 4 schematically shows in the form of blocks an example of embodiment of a control circuit 300 of the type of the control circuit 105 of the generator 100 described in relation with FIG. 1.

As described in relation with FIG. 1, control circuit 300 comprises a selection unit or circuit 301, of the type of selection unit or circuit 1051, and a regulation unit or circuit 302, of the type of regulation unit or circuit 1052.

Selection unit 301 receives, as an input, the output digital wobulated signal WO_OUT of the generator comprising the control circuit, and a control signal CMD_SEL originating from regulation unit 301. The control unit delivers, as an output, the control signals CMD_N1, ... CMD_N12 of the delay elements of the chain having the control circuit associated therewith.

Regulation unit 302 receives, as an input, the output digital wobulated signal WO_OUT and delivers, to selection unit 301, control signal CMD_SEL.

Regulation unit 302 comprises:
a generator 3021 (Clk_ref) of a clock signal at fixed frequency;
a frequency-dividing circuit 3022 (Freq_div);
a counter 3023 (CNT); and
a compensation circuit 3024 (Comp).

Generator 3021 is adapted to delivering a reference clock signal Ref. According to an example, generator 3021 is a phase-locked loop (PLL).

Frequency dividing circuit 3022 enables to control the enabling of counter 3023. The frequency dividing circuit receives reference clock signal Ref, and delivers a signal ena for enabling counter 3023. More particularly, frequency dividing circuit 3022 determines the duration of the regulation mode, by setting enable signal ena to a high state for said duration, and to a low state otherwise.

Counter 3023 comprises an enable input ena and a clock input clk, and an output. Enable input ena receives enable signal ena, and the clock input receives output signal WO_OUT. The counter delivers, as an output, a digital signal representative of a counting result. Counter 3023 is adapted to counting, for a certain time period, or calculation window, the number of rising edges of the signal that it receives on its clock input, and thus output signal WO_OUT. The result of this counting is delivered as an output.

Compensation circuit 3024 comprises an input receiving the output signal of counter 3023, and an output delivering control signal CMD_SEL.

Two embodiments are described hereafter and are based on the same postulates. A first postulate is that the number k2 of delay elements of group G2 is fixed. A second postulate is that the delay elements of the chain of the generator all add the same delay and that control signal CMD_SEL is a signal representing a relative number H which is to be added to numbers k1 and k3 in order to regulate generator 100, also called regulation control signal H.

According to a first embodiment, the compensation circuit determines number H by using the following formula:

$$H = \frac{\left(\frac{C}{Rf} - \frac{C}{M}\right)}{S} \qquad \text{Math 1}$$

where:
C represents the time period during which the counter performs its calculation;
Rf represents the number of reference rising edges;
M represents the value measured by counter 3023 during time period C; and
S represents the duration of a delay of a delay element.

An advantage is that by regulating the generator by using the formula of this first embodiment, the signal is regulated in a single iteration.

According to a second embodiment, the compensation circuit determines number H by using the following formula:

$$H = (M - Rf) * K \qquad \text{Math 2}$$

where:
M and Rf have already been defined hereabove; and
K is a linear approximation constant depending on the variables Rf, M, C, and S defined hereabove.

According to an example, constant K may be defined by the following mathematical formula:

$$K = \frac{C * S}{Rf * M} \qquad \text{Math 3}$$

An advantage of this second embodiment over the first embodiment is that it is easier to implement.

Other methods of calculation and optimization of the regulation are within the abilities of those skilled in the art.

FIG. 5 schematically shows in the form of blocks an example of embodiment of a control circuit 400 of the type of the control circuit 105 of the generator 100 described in relation with FIG. 1.

Control circuit 400 has elements common with the control circuit 300 described in relation with FIG. 1. These elements are not described again in detail, and only the differences between control circuits 300 and 400 are highlighted.

Thus, control circuit 400 comprises selection unit or circuit 301 and a regulation unit or circuit 402, of the type of regulation unit 1052.

Regulation unit 402 receives, as an input, the output digital wobulated signal WO_OUT and delivers, to selection unit 301, control signal CMD_SEL.

Regulation unit 402 comprises elements similar to the regulation unit 302 of control circuit 300, but which are arranged differently. Regulation unit 402 comprises:
a generator 4021 (Clk_ref) of a clock signal at fixed frequency;
a frequency-dividing circuit 4022 (Freq_div);
a counter 4023 (CNT); and
a compensation circuit 4024 (Comp).

Generator 4021 is adapted to delivering a reference clock signal Ref. According to an example, generator 4021 is a phase-locked loop (PLL).

Frequency dividing circuit 4022 enables to control the enabling of counter 4023. The frequency dividing circuit receives the output digital wobulated signal WO_OUT, and delivers a signal ena for enabling counter 4023. More particularly, frequency dividing circuit 3022 determines the duration of the regulation mode, by setting enable signal ena to a high state for said duration, and to a low state otherwise.

The frequency dividing circuit receives, as an input, output signal WO_OUT and delivers a reference signal WO_OUT'.

Counter 4023 comprises an enable input ena and a clock input clk, and an output. Enable input ena receives reference signal WO_OUT', and the clock input receives reference signal Ref. The counter delivers, as an output, a digital signal representative of a counting result. Counter 4023 is adapted to counting, for a certain time period, or calculation window, the number of rising edges of the signal that it receives on its clock input, and thus reference signal Ref. The result of this counting is delivered as an output.

Compensation circuit 4024 comprises an input receiving the output signal of counter 4023, and an output delivering control signal CMD_SEL.

According to an embodiment, a first postulate is that the number k2 of delay elements of group G2 is fixed. A second postulate is that the delay elements of the chain of the generator all add the same delay and that control signal CMD_SEL is a signal representing a relative number H which is to be added to numbers k1 and k3 to regulate generator 100.

Compensation circuit 4024 determines number H, for example, by using the following formula:

$$H = (Rf - M) \frac{T\_clk\_ref}{2 * S * DIV} \qquad \text{Math 4}$$

where:
Rf represents the number of reference rising edges;
M represents the number of rising edges of signal Ref measured by counter 4023 during time period C;
S represents the duration of a delay of a delay element;
T_clk_ref represents the period of reference signal Ref; and
DIV represents the number of rising edges measured by a frequency dividing circuit 4023.

An advantage is that by regulating the generator by using the formula of this embodiment, the signal is regulated in a single iteration.

Another advantage of this embodiment over the first embodiment is that it is easier to implement.

Figure 6:
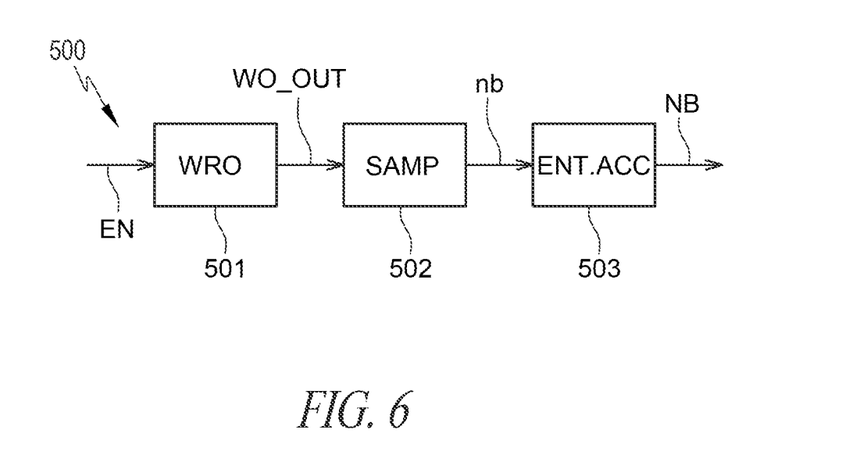
FIG. 6 schematically shows in the form of blocks an example of embodiment of a random number generator using a generator of FIG. 1.

FIG. 6 is a diagram schematically illustrating in the form of blocks an embodiment of a random number generator 500.

Generator 500 comprises:
- a generator 501 (WRO) of a digital wobulated signal of the type of the generator 100 described in relation with FIGS. 1 and 2;
- a sampling circuit 502 (SAMP); and
- a circuit 503 (ENT. ACC) implementing an entropy accumulation function.

Digital wobulated signal generator 501 receives, as an input, enable signal EN and delivers, as an output, digital wobulated signal WO_OUT, according to the operation described in relation with FIG. 1.

Sampling circuit 502 receives, as an input, signal WO_OUT and delivers, as an output, a data bit representing a random number nb. According to an embodiment, circuit 502 may comprise a D-type flip-flop and a circuit generating a clock signal.

Circuit 503 is a circuit implementing an entropy accumulation function, that is, a function taking one or a plurality of inputs and having its single output keeping the entropy of the inputs. In other words, if at least one of the inputs is random, the output of the function is also random. According to an embodiment, circuit 503 may implement an XOR logic function. Circuit 503 receives, as an input, random number nb and outputs a data bit representing a random number NB.

Random number generator 500 operates as follows. The wobulated signal generator generates signal WO_OUT, which is then sampled by circuit 502 to deliver random number nb. Random number nb then transits through the entropy accumulation function to provide number NB. As an example, the entropy accumulation function may successively record a plurality of random numbers nb generated one after the others to generate number NB.

Figure 7:
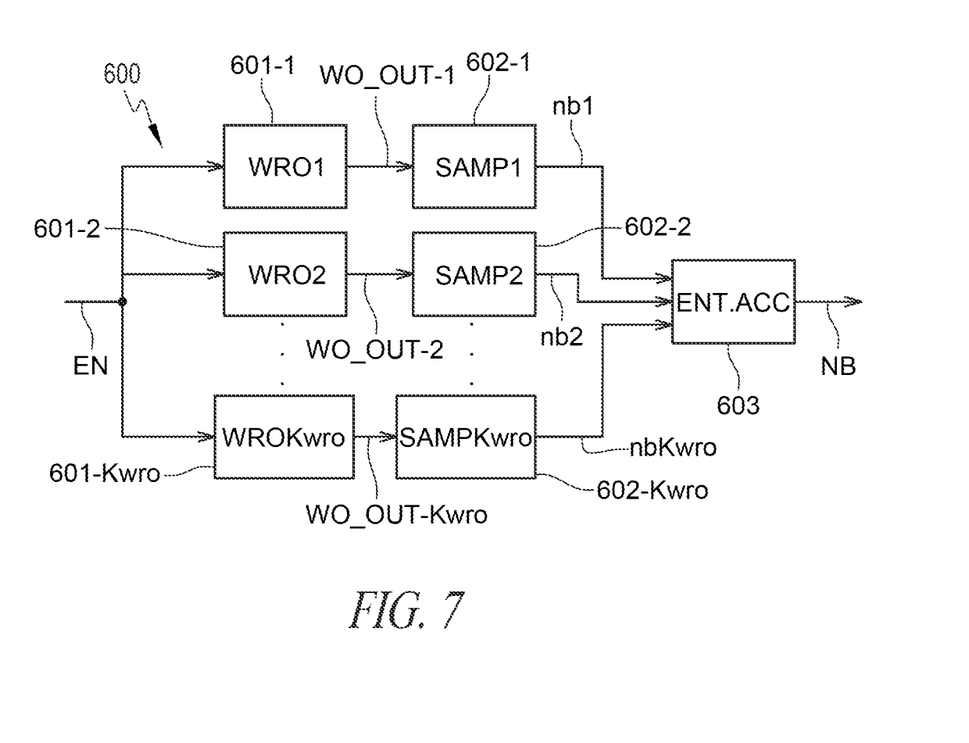
FIG. 7 schematically shows in the form of blocks another example of embodiment of a random number generator using a generator of FIG. 1.

FIG. 7 is a diagram schematically illustrating in the form of blocks another embodiment of a random number generator 600.

Generator 600 comprises:
- Kwro digital wobulated signal generators 601-j (WRO1, WRO2, . . . , WROKwro), j varying from 1 to Kwro, of the type of the generator 100 described in relation with FIGS. 1 and 2;
- Kwro sampling circuits 602-j (SAMP1, SAMP2, . . . , SAMPKwro); and
- a circuit 603 (ENT. ACC) implementing an entropy accumulation function.

Generators 601-j are arranged in parallel with one another. Each generator 601-j receives, as an input, enable signal EN and delivers, as an output, a digital wobulated signal WO_OUTj, according to the operation described in relation with FIG. 1.

Sampling circuits 602-j are arranged in parallel with one another, and at the output of each generator 601-j. Each sampling circuit 602-j receives, as an input, signal WO_OUTj and delivers, as an output, a data bit representing a random number nbj. According to an example of embodiment, each circuit 602-j may comprise a D-type flip-flop coupled to a circuit, for example, common to all circuits 602-j, generating a clock signal.

Circuit 603 is a circuit implementing an entropy accumulation function, of the type of the circuit 503 described in relation with FIG. 6. Circuit 603 comprises Kwro inputs, each receiving a random number nbj, and an output delivering random number NB. According to an embodiment, circuit 603 may implement an XOR logic function. According to another example, the storage function may be a compression function.

Random number generator 600 operates as follows. Wobulated signal generators 601-j generate, all in parallel, a signal WO_OUTj. Each signal WO_OUTj is then sampled by circuit 602-j to deliver random number nbj. Circuit 603 uses random numbers nbj as an input to deliver final random number NB.

The number Kwro of wobulated signal generators may be in the range from 2 to 50. The selection of number Kwro is determined by the selected compromise between the bulk and the rapidity of the random number generator. Indeed, the larger number Kwro, the more generator 600 will be capable of rapidly delivering a random number NB, but the more its number of electronic components increases, and thus the more its physical size increases.

Figure 8:
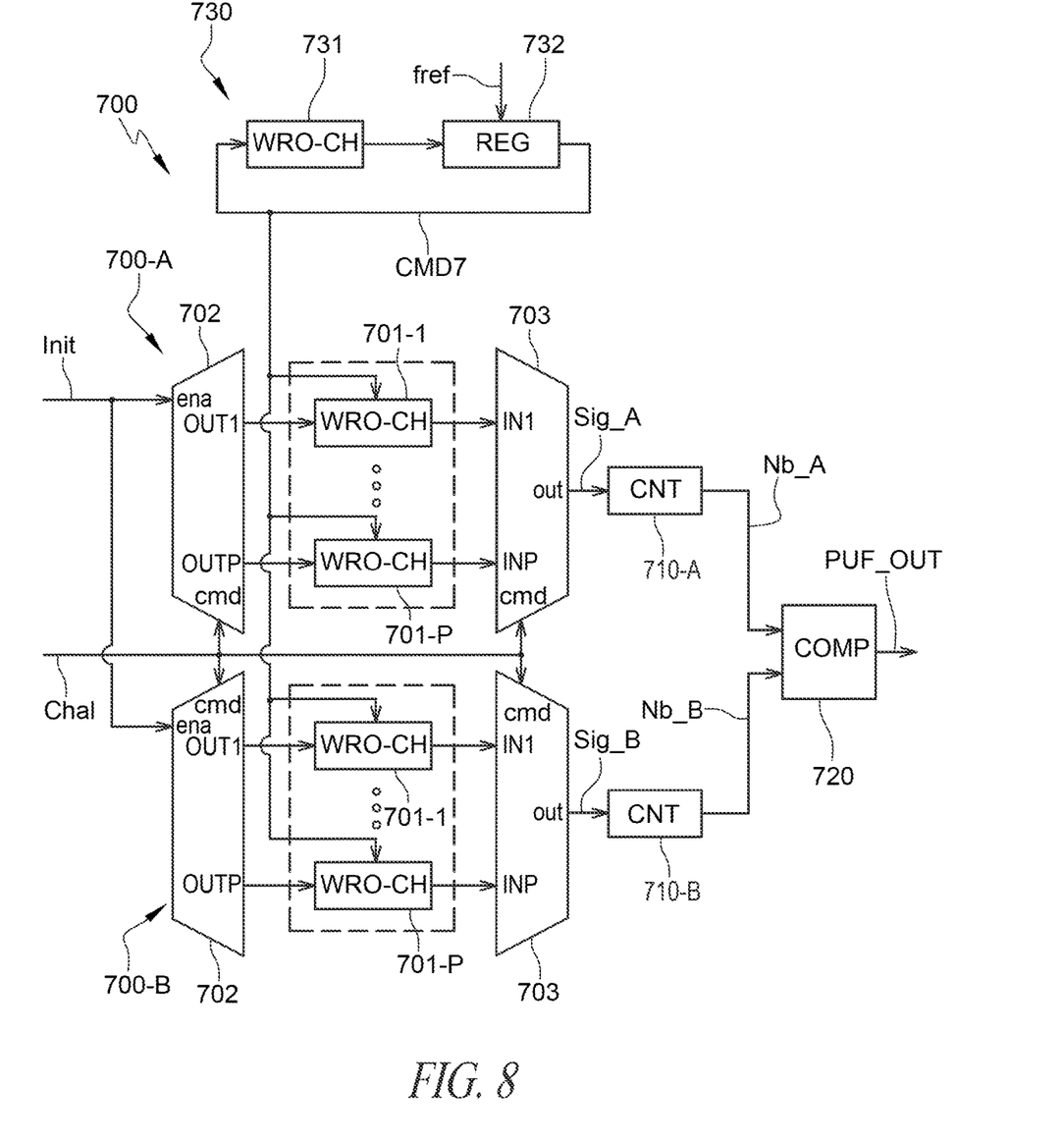
FIG. 8 schematically shows in the form of blocks an example of an embodiment of a device adapted to implementing a physical unclonable function (PUF).

FIG. 8 is a diagram schematically illustrating in the form of blocks an embodiment of a device 700 adapted to implementing a physical unclonable function (PUF), that is, a function having a unique and unclonable result for each device implementing it. This type of function may be used for the identification of electronic devices, or for the generation of data capable of being used as an intrinsic key.

Device 700 comprises two circuits 700-A and 700-B for generating two digital signals Sig-A and Sig-B. According to an embodiment, circuits 700-A and 700-B are identical to within the differences linked to the manufacturing method. Device 700 further comprises a counter 710-A (CNT) adapted to receiving signal Sig-A and a counter 710-B (CNT) adapted to receiving signal Sig-B and to counting, for example, their number of high states for a given time period. According to an embodiment, counters 710-A and 710-B are identical to within the differences linked to the manufacturing method. Counter 710-A, respectively 710-B, delivers as an output a signal representing a number Nb-A, respectively Nb-B. Device 700 further comprises a comparator 720 (COMP) adapted to receiving and to comparing signals Nb-A and Nb-B to deliver as an output a signal PUF_OUT representing the output of the unclonable physical function. According to an example, signal PUF_OUT represents a number.

Circuits 700-A and 700-B each comprise P generators of wobulated signals 701-1, . . . , 701-P (WRO-CH) arranged in parallel with one another between an input selection circuit 702, for example, an input multiplexer, and an output selection circuit 703, for example, an output multiplexer.

More particularly, each wobulated signal generator 701-1, . . . , 701-P is a generator of a wobulated signal of the type of that described in relation with FIG. 1, with the difference that all wobulated signal generators 701-1, . . . , 701-P, that is, the wobulated signal generators of circuits 700-A and 700-B, have a control circuit comprising no regulation circuit but only an input terminal enabling the selection circuit of the control circuit to receive a control signal CMD7, of the type of the control signal CMD-SEL described in relation with FIG. 1. In other words, generators 701-1, . . . , 701-P comprise:
- a logic AND-type gate of the type of the gate 101 described in relation with FIG. 1;
- an inverting-type logic gate of the type of the gate 102 described in relation with FIG. 1;
- a flip-flop of the type of the flip-flop 103 described in relation with FIG. 1;
- a chain of delay elements of the type of the chain 103 described in relation with FIG. 1; and a control circuit of the type of the control circuit 105 described in relation with FIG. 1, but comprising a single selection circuit of the type of selection circuit 1051, and an input terminal adapted to receiving control signal CMD7.

Further, each input selection circuit 702 comprises an input ena and P outputs OU1, . . . , OUTP. The input receives an enable signal Init, and each output is coupled to an input of one of the wobulated signal generators 701-1, . . . , 701-P. Each output selection circuit 703 comprises P inputs IN1, . . . , INP and an output out. Each input is coupled to an output of one of wobulated signal generators 701-1, . . . , 701-P, and the output delivers signal Sig-A, respectively Sig-B. Input and output selection circuits 702 and 703 further comprise a control terminal cmd receiving a common control signal Chal. Control signal Chal enables to notify input selection circuit 702 of which output is to be couple to the input, and enables to notify output selection circuit 703 of which input is to be coupled to the output. In other words, control signal Chal indicates to the input and output circuits which generator among generators 701-1, 701-P is to be selected. According to an embodiment, the input and output selection circuits 702 and 703 of circuits 700-A and 700-B receive the same control signal Chal.

Device 700 further comprises a control unit or circuit 730 comprising a wobulated signal generator of the type of the wobulated signal generator 100 described in relation with FIG. 1. The wobulated signal generator of control unit 730 is represented by:

a block 731 representing the wobulated signal generator without its regulation circuit; and a block 732 (REG) representing the regulation circuit of the wobulated signal generator.

As described in relation with FIG. 1, the regulation circuit 732 of generator 731 is adapted to regulating the average frequency of the output signal of generator 731 so that this average frequency approaches an average reference frequency $f_{ref}$. The regulation circuit 732 of generator 731 thus delivers control signal CMD7 to regulate the frequency of generator 731 but also to regulate the frequencies of the signals delivered by the generators 701-1, . . . , 701-P of circuit 700-A and by the generators 701-1, . . . , 701-P of circuit 700-B.

Device 700 operates as follows. Control signal Chal indicates to the selection circuits 702 and 703 of circuits 700-A and 700-B the generator 701-1, . . . , or 701-P to be selected. Signal Init switches to a high state, and the selected generator 701-1, . . . , or 701-P delivers the output signal Sig-A, Sig-B having its average frequency regulated by control signal CMD7. Counters 710-A and 710-B provide numbers Nb-A and Nb-B based on signals Sig-A and Sig-B. Comparator 720 compares numbers Nb-A and Nb-B to deliver the signal PUF_OUT representing the output of device 700.

An advantage of device 700 is that it is not affected by locking phenomena that could affect the generators 701-1, . . . , 701-P of circuits 700-A and 700-B. Indeed, generator 700 being capable of regulating the average frequencies of the output signals of these generators, is capable of preventing the occurrence of a locking phenomenon.

The embodiments of the wobulated signal generator have been described in relation with an example of application to a random number generator. However, the described embodiments may be used in other applications such as, for example, a jitter clock used as a countermeasure against cryptographic attacks.

Figure 9:
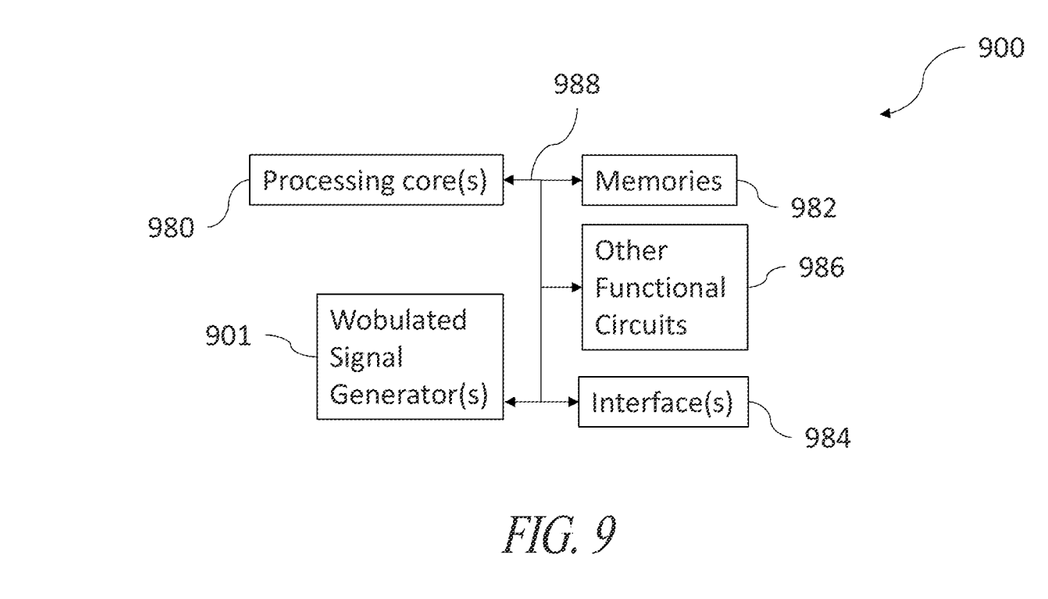
FIG. 9 is a functional block diagram of an embodiment of a system.

FIG. 9 is a functional block diagram of a system or device 900 including one or more wobulated signal generators 901 according to an embodiment. The system 900, which may be a system on a chip, also comprises one or more processing cores or circuits 980, one or more memories 982, one or more interfaces 984, one or more other functional circuits 986, and one or more bus systems 988.

The processing cores 980 may comprise, for example, one or more processors, a state machine, a microprocessor, a programmable logic circuit, discrete circuitry, logic gates, registers, etc., and various combinations thereof. The processing cores may control overall operation of the system 900, execution of application programs by the system 900 (e.g., programs which may use random numbers, results of physical unclonable functions, and other information, and various combinations thereof, to perform various functions), etc. The memories 982 may comprise one or more volatile and/or non-volatile memories which may store, for example, all or part of instructions and data related to control of the system 900, applications and operations performed by the system 900, etc. One or more of the memories 982 may include a memory array, which, in operation, may be shared by one or more processes executed by the system 900.

The one or more interfaces 984 (e.g., wireless communication interfaces, wired communication interfaces, etc.), in operation, may facilitate communication between the system 900 and other systems and devices (e.g. peripherals). The other functional circuits 986, may include antennas, power supplies, one or more built-in self-test (BIST) circuits, sensors, random number generators (see random number generator 500 of FIG. 6 or random number generator 600 of FIG. 7), physical unclonable function devices (see device 700 of FIG. 8), etc., and various combinations thereof. The main bus system 988 may include one or more data, address, power and/or control buses coupled to the various components of the system 900.

Embodiments of the system 900 of FIG. 9 may include more components than illustrated, may include fewer components than illustrated, may combine components, may separate components into sub-components, and various combination thereof. For example, one or more wobulated signal generators may be integrated into one or more of the other functional circuits (e.g., a random number generator or physically unclonable function device or circuit).

In an embodiment, a device comprises: a chain of delay elements including first delay elements, second delay elements, and third delay elements; control circuitry coupled to the chain of delay elements; and an output node coupled to the chain of delay elements. The control circuitry, in operation: enables a number of the first delay elements; disables a number of the third delay elements; enables a selected number of the second delay elements, defining a period of time between two consecutive rising edges of a digital wobulated signal at the output node; monitors an average frequency of the digitally wobulated signal; and selectively modifies the number of enabled first delay elements and the number of disabled third delay elements based on the monitored average frequency of the digitally wobulated signal. In an embodiment, the selected number of second delay elements is a constant. In an embodiment, the selected number of second delay elements is variable. In an embodiment, the control circuitry, in operation, selectively modifies the number of enabled first delay elements and the number of disabled third delay elements based on the monitored average frequency of the digitally wobulated signal and a reference frequency. In an embodiment, in response to the monitored average frequency being greater than the reference frequency, the control circuitry increases the number of first elements enabled and decreases the number of third elements disabled. In an embodiment, in response to the monitored average frequency being less than the reference frequency, the control circuitry decreases the number of first elements enabled and increases the number of third elements disabled. In an embodiment, the control circuitry comprises: a clock signal generator, which, in operation, generates a reference clock signal at the reference frequency; and a counter, which, in operation, counts a number of rising edges of the wobulated signal. In an embodiment, the clock signal generator comprises a phase-locked loop and the reference frequency is a constant. In an embodiment, the delay elements of the chain, when enabled, add a same delay time period to a received digital signal; and the control circuitry, in operation, generates a regulation control value H according to:

$$H = \frac{\left(\frac{C}{Rf} - \frac{C}{M}\right)}{S}$$

where:
C represents a sampling time period;
Rf represents a number of rising edges of the reference clock signal during the sampling time period;
M represents a number of rising edges of the wobulated signal counted by the counter during the sampling time period; and
S represents a duration of the delay time period of a delay element of the chain of delay elements.

In an embodiment, the delay elements of the chain, when enabled, add a same delay time period to a received digital signal; and the control circuitry, in operation, generates a regulation control value H according to:

$$H=(M-Rf)*K$$

where:
Rf represents a number of rising edges of the reference clock signal during a sampling time period C;
M represents a number of rising edges of the wobulated signal counted by the counter during the sampling time period C; and
K is a constant depending on the sampling time period C and a duration S of the delay time period of a delay element of the chain of delay elements.

In an embodiment, constant K is has a value according to:

$$K = \frac{C*S}{Rf*M}.$$

In an embodiment, the delay elements of the chain, when enabled, add a same delay time period to a received digital signal; and the control circuitry comprises a frequency dividing circuit, which, in operation, enables the counter, and the control circuitry, in operation, generates a regulation control value H according to:

$$H = (Rf - M)\frac{(2*T\_clk\_ref)}{S*DIV}$$

where:
Rf represents a number of rising edges of the reference clock signal during a sampling time period;
M represents a number of rising edges of the wobulated signal counted by the counter during the sampling time period; and
S represents a duration of the delay time period of a delay element of the chain of delay elements;
T_clk_ref represents the period of reference signal Ref; and
DIV represents a number of rising edges measured by a frequency dividing circuit enabling the counter.

In an embodiment, a first input of the first delay elements is coupled to an input of the chain of delay elements; a first output of the first delay elements is coupled to a first input of the second delay elements; a first output of the second delay elements is coupled to a first input of the third delay elements; an output of the third delay elements is coupled to a second input of the second delay elements; a second output of the second delay elements is coupled to a second input of the first delay elements; and a second output of the first delay elements is coupled to an output of the chain of delay elements. In an embodiment, the device comprises a flip-flop coupled to the output of the chain of delay elements, wherein the output node is coupled to an output of the flip-flop and to an input of the control circuitry.

In an embodiment, a system comprises: a memory; and a wobulated signal generator coupled to the memory, the wobulated signal generator including: a chain of delay elements including first delay elements, second delay elements, and third delay elements; control circuitry coupled to the chain of delay elements; and an output node coupled to the chain of delay elements. The control circuitry, in operation: enables a number of the first delay elements; disables a number of the third delay elements; enables a selected number of the second delay elements, defining a period of time between two consecutive rising edges of a digital wobulated signal at the output node; monitors an average frequency of the digitally wobulated signal; and selectively modifies the number of enabled first delay elements and the number of disabled third delay elements based on the monitored average frequency of the digitally wobulated signal. In an embodiment, the system comprises a random number generator including the wobulated signal generator. In an embodiment, the system comprises a plurality of wobulated signal generators. In an embodiment, the system comprises a random number generator including the plurality of wobulated signal generators. In an embodiment, the system comprises physical unclonable function circuitry including the plurality of wobulated signal generators. In an embodiment, the system comprises a second chain of delay elements coupled to the control circuitry.

In an embodiment, a method comprises: generating a delayed digital signal using a chain of delay elements including first delay elements, second delay elements, and third delay elements; and generating a digital wobulated signal based on the delayed signal. The generating the delayed digital signal comprises: enabling a number of the first delay elements; disabling a number of the third delay elements; enabling a selected number of the second delay elements, defining a period of time between two consecutive rising edges of the digital wobulated signal; monitoring an average frequency of the digitally wobulated signal; and selectively modifying the number of enabled first delay elements and the number of disabled third delay elements based on the monitored average frequency of the digitally wobulated signal. In an embodiment, the selected number of second delay elements is a constant. In an embodiment, the selected number of second delay elements is variable. In an embodiment, the method comprises selectively modifying the number of enabled first delay elements and the number of disabled third delay elements based on the monitored average frequency of the digitally wobulated signal and a reference frequency. In an embodiment, the method comprises: in response to the monitored average frequency being greater than the reference frequency, increasing the number of first elements enabled and decreasing the number of third elements disabled; and in response to the monitored average frequency being less than the reference frequency, decreasing the number of first elements enabled and increasing the number of third elements disabled. In an embodiment, the method comprises generating a random number using the digitally wobulated signal. In an embodiment, the method comprises generating a plurality of digitally wobulated signals. In an embodiment, the method comprises generating a random number generator using the plurality of digitally wobulated signals. In an embodiment, the method comprises generating a device identification number using the plurality of digitally wobulated signals.

Various embodiments and variants have been described. Those skilled in the art will understand that certain features of these various embodiments and variants may be combined, and other variants will occur to those skilled in the art.

An embodiment provides a generator of a digital wobulated signal comprising a chain of delay elements capable of being enabled adapted to delaying a digital signal, among which a first number of first elements are active, a second number of second elements are selectable, and a third number of third elements are disabled, the time period between two consecutive rising edges of said digital wobulated signal being defined by the selection of a fourth number of the second elements, the generator comprising a control circuit adapted to modifying the first and third numbers if the average frequency of said digital wobulated signal is different from a reference frequency.

Another embodiment provides a method of controlling a generator of a digital wobulated signal comprising a chain of delay elements capable of being enabled adapted to delaying a digital signal, among which a first number of first elements are active, a second number of second elements are selectable, and a third number of third elements are disabled, the time period between two consecutive rising edges of said digital wobulated signal being defined by the selection of a fourth number of the second elements, the generator comprising a control circuit adapted to modifying the first and third numbers if the average frequency of said digital wobulated signal is different from a reference frequency.

According to an embodiment, the second number is always constant.

According to an embodiment, the second number is variable.

According to an embodiment, if the average frequency of said signal is greater than the reference frequency, then the first number is increased, and the third number is decreased.

According to an embodiment, if the average frequency of said signal is smaller than the reference frequency, then the first number is decreased, and the third number is increased.

According to an embodiment, the control circuit comprises:
 a generator of a clock signal at constant frequency having, as a frequency, the reference frequency;
 a counter; and
 a compensation circuit calculating a regulation control value H.

According to an embodiment, said generator of a clock signal at constant frequency is a phase-locked loop.

According to an embodiment, all the delay elements add a delay time period identical to a digital signal, and regulation control value H is calculated by using the following mathematical formula:

$$H = \frac{\left(\frac{C}{Rf} - \frac{C}{M}\right)}{S}$$

where:
 C represents the time period during which said counter performs its calculation;
 Rf represents the number of reference rising edges;
 M represents the value measured by the counter during time period C; and
 S represents the duration of a delay of a delay element.

According to an embodiment, all the delay elements add a delay identical to a digital signal, and regulation control value H is calculated by using the following mathematical formula:

$$H = (M - Rf) * K$$

where:
 Rf represents the number of reference rising edges;
 M represents the value measured by the counter during time period C; and
 K is a constant depending on time periods C and S.

According to an embodiment, constant K is provided by the following mathematical formula:

$$K = \frac{C * S}{Rf * M}$$

According to an embodiment, all the delay elements add a delay identical to a digital signal, and regulation control value H is calculated by using the following mathematical formula:

$$H = (Rf - M)\frac{(2 * \text{T\_clk\_ref})}{S * DIV}$$

where:
 Rf represents the number of reference rising edges;
 M represents the value measured by the counter;
 S represents the duration of a delay of a delay element;
 T_clk_ref represents the period of reference signal Ref; and
 DIV represents the number of rising edges measured by a frequency dividing circuit enabling said counter.

Another embodiment provides a random number generator comprising at least one previously-described digital wobulated signal generator.

Another embodiment provides a random number generator comprising at least two previously-described digital wobulated signal generators.

Another embodiment provides a device adapted to implementing a physical unclonable function comprising at least one previously-described wobulated signal generator.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a chain of delay elements including first delay elements, second delay elements, and third delay elements;
control circuitry coupled to the chain of delay elements; and
an output node coupled to the chain of delay elements, wherein the control circuitry, in operation:
enables a number of the first delay elements;
disables a number of the third delay elements;
enables a selected number of the second delay elements, defining a period of time between two consecutive rising edges of a digital wobulated signal at the output node;
monitors an average frequency of the digitally wobulated signal; and
selectively modifies the number of enabled first delay elements and the number of disabled third delay elements based on the monitored average frequency of the digitally wobulated signal.

2. The device of claim 1, wherein the selected number of second delay elements is a constant.

3. The device of claim 1, wherein the selected number of second delay elements is variable.

4. The device of claim 1, wherein the control circuitry, in operation, selectively modifies the number of enabled first delay elements and the number of disabled third delay elements based on the monitored average frequency of the digitally wobulated signal and a reference frequency.

5. The device of claim 4, wherein, in operation, in response to the monitored average frequency being greater than the reference frequency, the control circuitry increases the number of first elements enabled and decreases the number of third elements disabled.

6. The device of claim 4, wherein, in operation, in response to the monitored average frequency being less than the reference frequency, the control circuitry decreases the number of first elements enabled and increases the number of third elements disabled.

7. The device of claim 4, wherein the control circuitry comprises:
a clock signal generator, which, in operation, generates a reference clock signal at the reference frequency; and
a counter, which, in operation, counts a number of rising edges of the wobulated signal.

8. The device of claim 7, wherein the clock signal generator comprises a phase-locked loop and the reference frequency is a constant.

9. The device of claim 7, wherein,
the delay elements of the chain, when enabled, add a same delay time period to a received digital signal; and
the control circuitry, in operation, generates a regulation control value H according to:

$$H = \frac{\left(\frac{C}{Rf} - \frac{C}{M}\right)}{S}$$

where:
C represents a sampling time period;
Rf represents a number of rising edges of the reference clock signal during the sampling time period;
M represents a number of rising edges of the wobulated signal counted by the counter during the sampling time period; and
S represents a duration of the delay time period of a delay element of the chain of delay elements.

10. The device of claim 7, wherein,
the delay elements of the chain, when enabled, add a same delay time period to a received digital signal; and
the control circuitry, in operation, generates a regulation control value H according to:

$H=(M-Rf)*K$ where:
Rf represents a number of rising edges of the reference clock signal during a sampling time period C;
M represents a number of rising edges of the wobulated signal counted by the counter during the sampling time period C; and
K is a constant depending on the sampling time period C and a duration S of the delay time period of a delay element of the chain of delay elements.

11. The device of claim 10, wherein constant K is has a value according to:

$$K = \frac{C*S}{Rf*M}.$$

12. The device of claim 7, wherein,
the delay elements of the chain, when enabled, add a same delay time period to a received digital signal; and
the control circuitry comprises a frequency dividing circuit, which, in operation, enables the counter, and the control circuitry, in operation, generates a regulation control value H according to:

$$H = (Rf - M)\frac{(2*\text{T\_clk\_ref})}{S*DIV}$$

where:
Rf represents a number of rising edges of the reference clock signal during a sampling time period;
M represents a number of rising edges of the wobulated signal counted by the counter during the sampling time period;
S represents a duration of the delay time period of a delay element of the chain of delay elements;
T_clk_ref represents the period of reference signal Ref; and
DIV represents a number of rising edges measured by a frequency dividing circuit enabling the counter.

13. The device of claim 1, wherein,
a first input of the first delay elements is coupled to an input of the chain of delay elements;
a first output of the first delay elements is coupled to a first input of the second delay elements;
a first output of the second delay elements is coupled to a first input of the third delay elements;
an output of the third delay elements is coupled to a second input of the second delay elements;
a second output of the second delay elements is coupled to a second input of the first delay elements; and
a second output of the first delay elements is coupled to an output of the chain of delay elements.

14. The device of claim 13, comprising a flip-flop coupled to the output of the chain of delay elements, wherein the output node is coupled to an output of the flip-flop and to an input of the control circuitry.

15. A system, comprising:
a memory; and
a wobulated signal generator coupled to the memory, the wobulated signal generator including:
a chain of delay elements including first delay elements, second delay elements, and third delay elements;
control circuitry coupled to the chain of delay elements; and
an output node coupled to the chain of delay elements, wherein the control circuitry, in operation:
enables a number of the first delay elements;
disables a number of the third delay elements;
enables a selected number of the second delay elements, defining a period of time between two consecutive rising edges of a digital wobulated signal at the output node;
monitors an average frequency of the digitally wobulated signal; and
selectively modifies the number of enabled first delay elements and the number of disabled third delay elements based on the monitored average frequency of the digitally wobulated signal.

16. The system of claim 15, comprising a random number generator including the wobulated signal generator.

17. The system of claim 15, comprising a plurality of wobulated signal generators.

18. The system of claim 17, comprising a random number generator including the plurality of wobulated signal generators.

19. The system of claim 17, comprising physical unclonable function circuitry including the plurality of wobulated signal generators.

20. The system of claim 15, comprising:
a second chain of delay elements coupled to the control circuitry.

21. A method, comprising:
generating a delayed digital signal using a chain of delay elements including first delay elements, second delay elements, and third delay elements; and
generating a digital wobulated signal based on the delayed signal, the generating the delayed digital signal comprising:
enabling a number of the first delay elements;
disabling a number of the third delay elements;
enabling a selected number of the second delay elements, defining a period of time between two consecutive rising edges of the digital wobulated signal;
monitoring an average frequency of the digitally wobulated signal; and
selectively modifying the number of enabled first delay elements and the number of disabled third delay elements based on the monitored average frequency of the digitally wobulated signal.

22. The method of claim 21, wherein the selected number of second delay elements is a constant.

23. The method of claim 21, wherein the selected number of second delay elements is variable.

24. The method of claim 21, comprising selectively modifying the number of enabled first delay elements and the number of disabled third delay elements based on the monitored average frequency of the digitally wobulated signal and a reference frequency.

25. The method of claim 24, comprising:
in response to the monitored average frequency being greater than the reference frequency, increasing the number of first elements enabled and decreasing the number of third elements disabled; and
in response to the monitored average frequency being less than the reference frequency, decreasing the number of first elements enabled and increasing the number of third elements disabled.

26. The method of claim 21, comprising generating a random number using the digitally wobulated signal.

27. The method of claim 21, comprising generating a plurality of digitally wobulated signals.

28. The method of claim 27, comprising generating a random number generator using the plurality of digitally wobulated signals.

29. The method of claim 27, comprising generating a device identification number using the plurality of digitally wobulated signals.

* * * * *